(12) United States Patent
Huber

(10) Patent No.: US 6,542,837 B1
(45) Date of Patent: Apr. 1, 2003

(54) WAFER PROCESSING SYSTEM

(75) Inventor: Ronald Huber, Tucson, AZ (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/574,823

(22) Filed: May 19, 2000

(30) Foreign Application Priority Data

May 19, 1999 (DE) .......................... 199 22 919

(51) Int. Cl.[7] .......................... G06F 19/00; G01N 37/00
(52) U.S. Cl. .......................... 702/81; 356/336
(58) Field of Search .......................... 438/16; 702/81; 356/336

(56) References Cited

U.S. PATENT DOCUMENTS

| | | | |
|---|---|---|---|
| 5,233,191 A | * | 8/1993 | Noguchi ..................... 356/336 |
| 5,617,340 A | * | 4/1997 | Cresswell et al. ..... 364/571.01 |
| 5,646,870 A | * | 7/1997 | Krivokapic et al. ........ 364/578 |
| 5,910,011 A | * | 6/1999 | Cruse .......................... 438/16 |
| 5,910,846 A | * | 6/1999 | Sandhu ....................... 356/381 |
| 5,923,430 A | * | 7/1999 | Worster et al. ............. 356/394 |
| 5,943,130 A | * | 8/1999 | Bonin et al. ................. 356/336 |
| 6,091,498 A | * | 7/2000 | Hanson et al. ............... 356/375 |
| 6,258,613 B1 | * | 7/2001 | Iwamatsu .................... 438/18 |

FOREIGN PATENT DOCUMENTS

| | | |
|---|---|---|
| DE | 195 18 238 | 11/1996 |
| DE | 196 12 195 | 11/1996 |
| DE | 196 13 615 | 11/1996 |
| DE | 197 11 702 | 6/1998 |
| DE | 198 07 649 | 8/1998 |

* cited by examiner

*Primary Examiner*—John S. Hilten
*Assistant Examiner*—Aditya Bhat
(74) *Attorney, Agent, or Firm*—Laurence A. Greenberg; Werner H. Stemer; Gregory L. Mayback

(57) ABSTRACT

A wafer processing system is described located in at least one clean room and having an arrangement of manufacturing units for performing individual manufacturing operations. In a manufacturing unit, measuring devices are provided for determining process parameters in order to check the quality of wafer processing of the manufacturing operations. Process data generated by the measuring devices is compiled continuously in a computing unit assigned to the manufacturing unit. Characteristic quantities for evaluating the quality of wafer processing are derived from this process data.

11 Claims, 2 Drawing Sheets

WAFER PROCESSING SYSTEM

BACKGROUND OF THE INVENTION

1. Field of the Invention

The present invention relates to a wafer processing system.

2. Description of the Related Art

Conventional wafer processing systems include a plurality of manufacturing units used to perform different wafer processing manufacturing operations. In particular, these manufacturing operations include processes in which layers are applied to the wafers. These include, for example, sputtering processes, vapor deposition processes, C.D. processes and thermal oxidation processes. Other manufacturing steps for processing wafers include, for example, etching processes, wet chemical processes, diffusion processes as well as different cleaning processes such as, for example, CAMP (Chemical Mechanical Polishing). One or more manufacturing units are provided for each of the corresponding manufacturing operations. In addition, separate measuring units where the quality of wafer processing can be checked are provided. All manufacturing operations performed in the manufacturing units are preferably checked using such measuring units.

The entire manufacturing process is subject to strict cleanliness requirements, so that the manufacturing units and measuring units are arranged in a clean room or a system of clean rooms.

The wafers are supplied to the individual manufacturing and measuring units in predetermined lot sizes via a transport system. For this purpose, the wafers are transported in transport containers, which may be designed as cartridges, for example. After the wafers have been processed in the manufacturing and measuring units, they are also removed by the transport system.

The transport system has a conveyor system, which may be designed as a roller conveyor, for example. In addition, the transport system may have a buffer system with a plurality of buffer stations for storing the transport containers with the wafers. The storage devices are preferably designed as stockers.

One disadvantage of this is that inspecting the quality of wafer processing is very time consuming and also requires a great structural complexity. After the wafers have been processed in a manufacturing unit, they must be sent to the corresponding measuring unit via the transport system, which often also requires temporary storage of the wafers. The measuring unit itself requires a considerable structural complexity. First, devices to receive the wafers from the transport system must be provided at the measuring unit, and then after the measurement has been performed, devices for delivering the wafers to the transport system must also be provided. In addition, the measuring unit has inspection devices where the quality of wafer processing is checked. Another disadvantage is that a considerable amount of space is required for the measuring units, so a large amount of floor area is required for the system accordingly. Since clean rooms themselves are also extremely expensive, this means a considerable cost factor for such systems.

One disadvantage of such measuring units is that measurements performed there permit only an indirect and incomplete conclusion regarding the quality of the manufacturing operation conducted in the manufacturing unit. For example, the layer thickness of wafers is typically determined in measuring units assigned to manufacturing units for applying layers to the wafers. To guarantee a sufficiently accurate measurement of layer thickness, the equipment required in the corresponding measuring unit is considerable.

Even if the layer thickness on the wafer can be determined very accurately, the source of error in the manufacturing process can be determined only inaccurately and incompletely when a deviation in the measured layer thickness from the predetermined set point is found. If the respective manufacturing unit is formed by a CVD installation for vapor phase deposition of silicon on the wafer, for example, then predetermined pressure and temperature conditions must prevail in the corresponding manufacturing unit, for example. However, if an erroneous layer thickness is found in the measuring unit, this does not permit a clear inference as to whether the correct temperature and pressure conditions have been selected for the manufacturing unit.

BRIEF SUMMARY OF THE INVENTION

An object of the present invention is to determine the quality of wafer processing as accurately and completely as possible with the least possible expense.

According to the present invention, to check the quality of wafer processing of one or more manufacturing operations conducted in a manufacturing unit, measuring devices are used in the manufacturing unit for determining process parameters.

The process data thus obtained from the measuring devices is compiled in a computing unit assigned to the manufacturing unit. Finally, characteristic quantities for evaluating the quality of wafer processing are derived from this process data.

According to the present invention, measuring devices which are usually already provided for monitoring the manufacturing operations in the individual manufacturing units are also used at the same time to check the quality of wafer processing.

This makes use of the circumstance that the result of processing a wafer in a manufacturing unit can be determined unambiguously by checking the process data generated in the manufacturing unit by using the measuring devices.

Since the characteristic quantities for evaluating the processing quality are obtained directly from the process data of the corresponding manufacturing unit determined by using the measurement devices, this makes it possible not only to determine whether a wafer has been processed correctly or defectively, but also in the event of a defect, to determine exactly the cause of the defect from the individual characteristic quantities. Depending on which of the characteristic quantities deviates from a setpoint or has other irregularities, such as a great scattering about a mean, it is possible to deduce the corresponding faulty process parameters from it. Consequently, not only is it possible to determine the quality of wafer processing through determination of the characteristic quantities according to the present invention, but also conclusions can be reliably drawn regarding possible errors in processing the wafers.

One advantage of the system according to the present invention is that the quality of processing of manufacturing steps can be checked in a manufacturing unit itself. Consequently, separate measuring units are no longer needed for such manufacturing units. This leads to considerable savings in terms of equipment and ultimately also of cost-intensive clean room space. Furthermore, wafer throughput time through the system is greatly shortened, because after the wafers have been processed in a manufacturing unit, they need no longer be sent to a downstream measuring unit via the transport system.

DETAILED DESCRIPTION OF THE INVENTION

Figure 1:
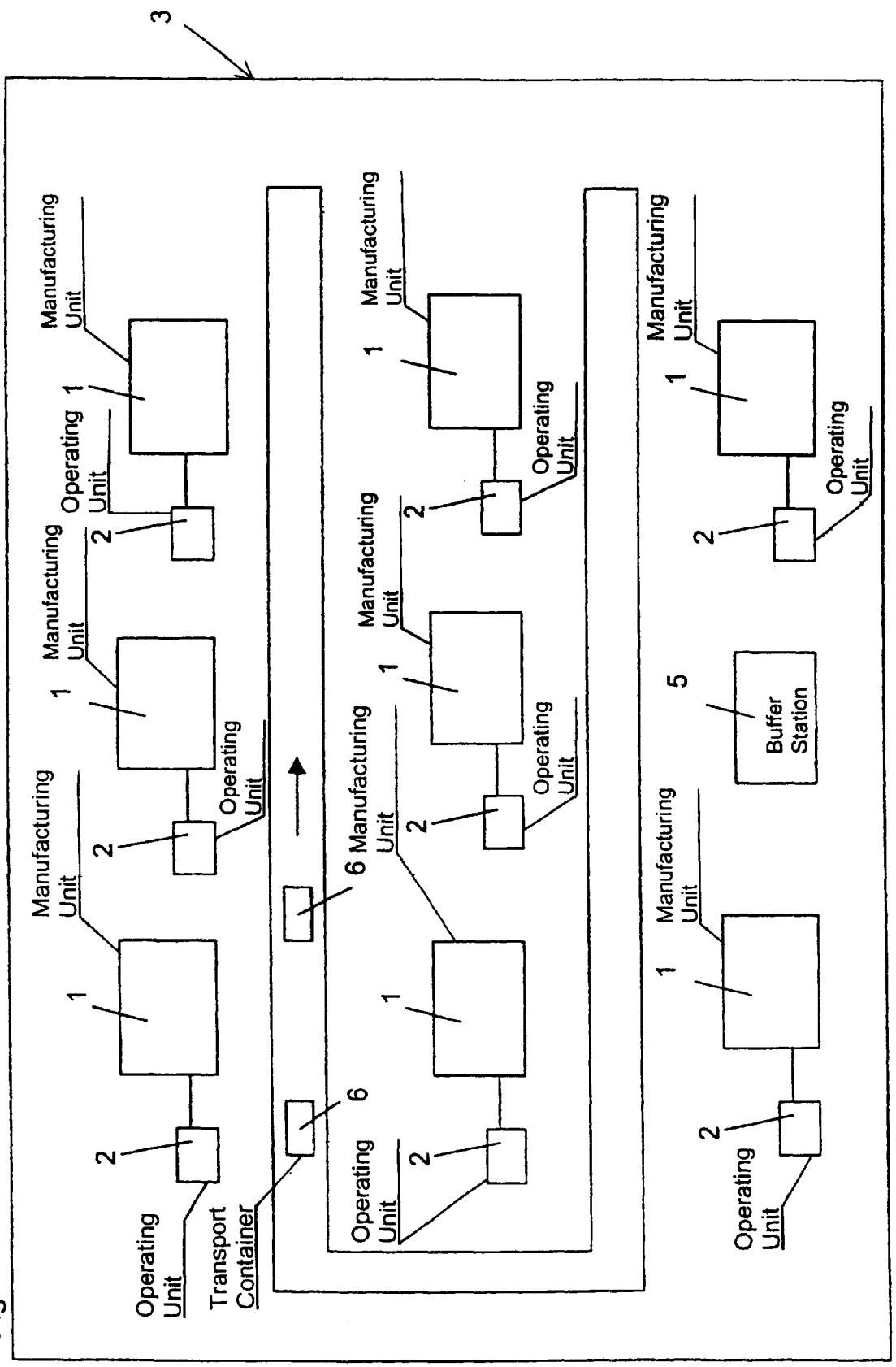
FIG. 1 shows a schematic representation of a wafer processing system having a plurality of manufacturing units according to the present invention.

FIG. 1 shows one embodiment of a wafer processing system according to the present invention. The system includes a plurality of manufacturing units 1 for performing the manufacturing operations necessary for the processing of wafers. Such manufacturing operations include in particular processing operations in manufacturing processes for applying layers to wafers, such as sputtering processes, chemical vapor deposition processes (CVD) and thermal oxidation processes. In addition, manufacturing units 1 are also used for performing etching processes, wet chemical processes, diffusion processes and cleaning processes. One or more manufacturing units 1 can be provided for the different manufacturing operations.

Each of manufacturing units 1 is assigned an operating unit 2. Operating units 2 may be designed in particular as computer-assisted parallel workstations. In particular, the different functions of respective manufacturing unit 1 can be checked by operating units 2.

Manufacturing units 1 having operating units 2 are arranged in a clean room 3. As an alternative, the system may be distributed over a system of clean rooms 3.

Manufacturing units 1 are connected to one another via a transport system. The transport system has a conveyor system 4 and a buffer system. Conveyor system 4 may be formed by a system of roller conveyors, for example. Buffer stations 5 of the buffer system are preferably designed as stockers.

The wafers are transported in transport containers 6 via conveyor system 4 in predetermined lot sizes. Transport containers 6 can be designed as cartridges or the like.

Figure 2:
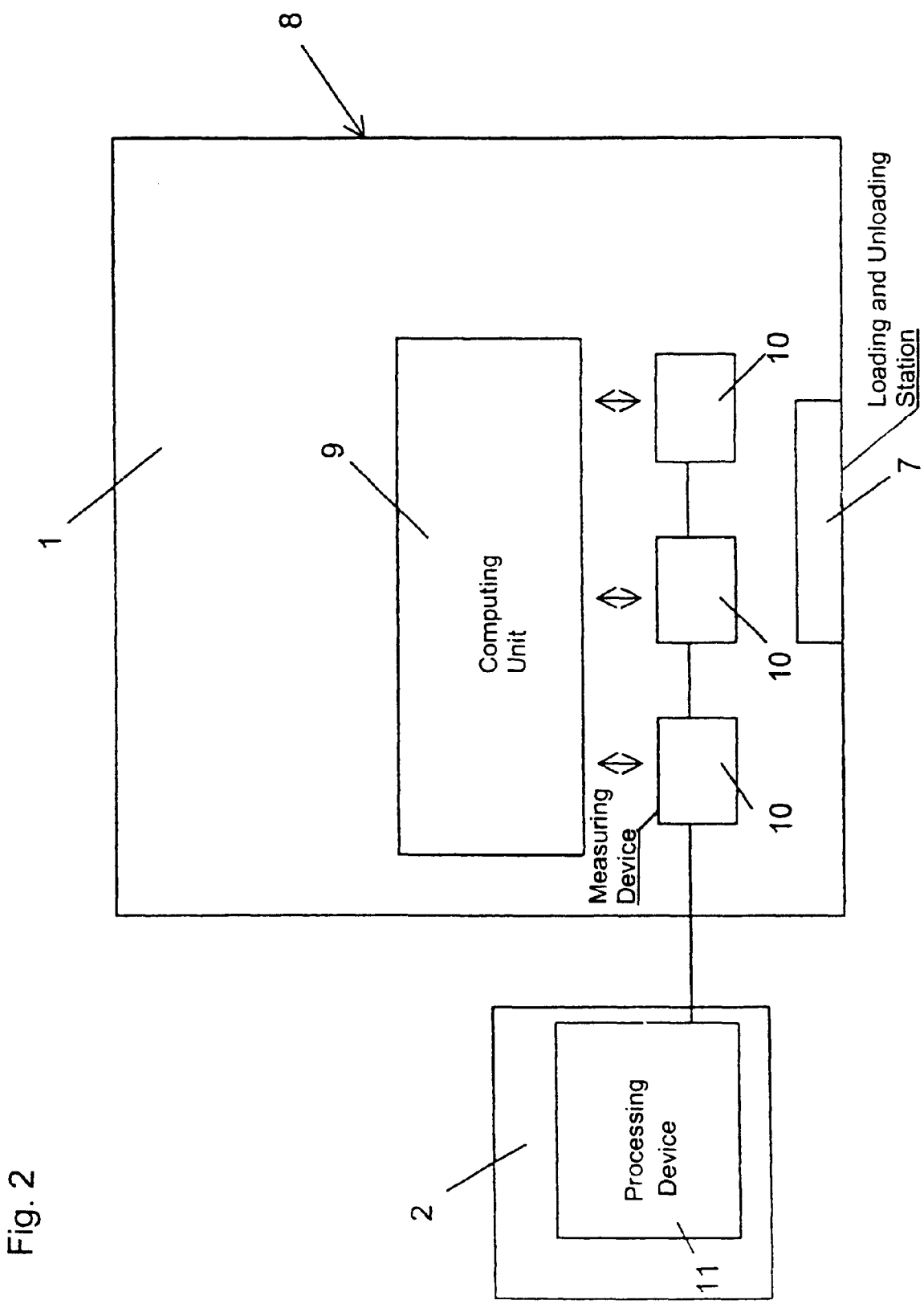
FIG. 2 shows a schematic representation of a manufacturing unit according to FIG. 1 with an operating unit and a plurality of measuring devices.

As FIG. 2 shows, manufacturing units 1 for supplying and removing transport containers 6 with wafers each have a loading and unloading station 7. Buffer stations 5 also have such a loading and unloading station 7.

FIG. 2 shows an example design of a manufacturing unit 1 for processing wafers. Manufacturing unit 1 in the present case is formed by a machine or system which is insulated from the rest of clean room 3 by walls 8. A processing device 9 for carrying out one or more manufacturing operations is located in manufacturing unit 1. In addition, multiple measuring devices 10 are provided in manufacturing unit 1. Various process parameters relevant for carrying out the manufacturing operations are detected with these measuring devices 10. Measuring devices 10 are connected to a computing unit 11 arranged in operating unit 2 for manufacturing unit 1. Operating unit 2 may be designed in particular as a staff workstation for the operating personnel, with manufacturing unit 1 being operable via a terminal (not shown). Operating unit 2 is preferably arranged in immediate proximity to respective manufacturing unit 1. Computing units 11 of individual manufacturing units 1 can also be connected to a central computing unit (not shown).

According to the present invention, the quality of processing of wafers processed in a manufacturing unit 1 is determined by the fact that the process parameters of the manufacturing operations performed in manufacturing unit 1 are monitored by using measuring devices 10. To do so, the corresponding process data is detected continuously by measuring devices 10 in the respective manufacturing operations.

Process data generated by measuring devices 10 is entered into connected computing unit 11. Characteristic quantities derived from the process data in computing unit 11 are used to evaluate the quality of wafer processing.

The choice of process parameters and thus also the choice of measuring devices 10 in a manufacturing unit 1 is based on the fact that the manufacturing operations performed in manufacturing unit 1 are defined as thoroughly as possible by the respective process parameters. The quality of wafer processing in manufacturing unit 1 can be defined accurately by these characteristic quantities.

Process parameters in carrying out manufacturing operations may be in particular the temperature and pressure conditions in the interior of manufacturing unit 1. This is important in particular if the wafers are processed openly in manufacturing unit 1. If the wafers are processed in an encapsulated processing device 9, the temperature and pressure conditions in the interior of processing device 9 should be taken into account as relevant process parameters. In this case, measuring devices 10 have temperature and pressure sensors. The temperature and pressure values thus determined are entered as process data into computing unit 11.

Additional process parameters to be taken into account are resources supplied to the wafers in manufacturing unit 1 for carrying out the manufacturing operations. Such resources include in particular ultrahigh purity water which is needed for carrying out cleaning processes, etching processes and diffusion processes, for example. In addition, chemicals in the form of gases and liquids are used as resources. For example, acid and alkaline solutions and hot nitrogen for drying the wafers are used in typical cleaning processes.

In this case, the temperature may be an important process parameter, and especially with resources in gaseous form, the pressure of the resource materials supplied to the wafers is an important process parameter. Measuring devices 10 then also include temperature and pressure sensors. In addition, the quantity of resources supplied to the wafers per unit of time must frequently also be taken into account as a relevant process parameter. In this case, measuring devices 10 include flow meters, flow monitors and the like.

Typically, the time characteristic of wafer processing in a manufacturing unit 1 is taken into account as an additional important process parameter. The processing time of wafers in individual processing devices 9 in particular is an important process parameter.

For example, in cleaning processes, the chronological sequence in which the wafers are processed with different liquid and gaseous chemicals must be taken into account. In particular, the time over which the individual chemicals act on the wafers is relevant. One example here would be thermal oxidation processes where an $SiO_2$ layer is applied to silicon wafers, for example. Typically, with a silicon wafer on whose surface there is already an $SiO_2$ layer, the thickness of this $SiO_2$ layer is increased by the fact that oxygen diffuses out of a gas space at the $SiO_2$ surface. The oxygen then diffuses through the $SiO_2$ layer and penetrates to the interface between the $SiO_2$ layer and the silicon layer of the wafer. At this interface, the oxygen reacts with silicon to form $SiO_2$, thus increasing the layer thickness.

In this case, the reaction time of the oxygen should also be taken into account in addition to such process parameters as the pressure and temperature of the oxygen atmosphere, because the layer thickness of the $SiO_2$ layer increases essentially in a linear relationship with time. Thus, the layer thickness of the $SiO_2$ layer can be determined directly by determining the reaction time.

Finally, the physical, electrical and/or mechanical parameters of processing devices 9 in manufacturing unit 1 are typically also be taken into account as process parameters. One example of this would be spin coating methods of applying layers to wafers. The wafer then lies flat on a rotating disk. The layer substance such as a photoresist dissolved in a solvent is dripped onto the surface of the wafer while the wafer is secured centrally on the rotating disk by vacuum. The layer substance is distributed radially on the wafer toward the outside by the rotation of the rotating disk. Rotation of the rotating disk is continued until the solvent has evaporated from the remaining layer. In this case, the rpm characteristic of the rotating disk must also be taken into account as a relevant process parameter in addition to the ambient temperature and the processing time.

The process data generated by individual measuring devices 10 is used to determine the characteristic quantities for the quality of wafer processing in computing unit 11.

In principle, the complete time characteristic of the various process data may be used here. The process data is preferably analyzed statistically here. In the simplest case, the averages of the individual process data and the respective standard deviations are formed. These averages and standard deviations then form the individual characteristic quantities.

Such an analysis of process data is recommended, for example, for vapor deposition methods of producing layers on wafers, such as the CVD process. In this process, certain vapors are passed over the heated surface of the wafers, on which the desired layer is then deposited. Then the vapors react on the surface of the wafer, forming the desired layer as the reaction product. In such processes, relevant process parameters to be taken into account include the temperature of the wafer surface and the pressure and temperature of the vapor atmosphere.

To determine the characteristic quantities, the pressure and temperature values determined are averaged over the reaction time of the vapors. The averages and standard deviations thus calculated form the characteristic quantities for evaluating the quality of wafer processing.

In many cases, it is appropriate to perform a statistical analysis where various process parameters are correlated. This is advantageous in particular when various process parameters depend on one another. The cross-correlation functions which form the characteristic quantities are preferably determined from the process data of the interdependent process parameters.

The characteristic quantities for individual manufacturing units 1 can be determined by inquiry directly at respective operating units 2, so that the quality of processing can be checked directly at respective manufacturing unit 1 by the operating personnel. In the event of inadequate processing quality, the fault in the wafer processing operation can be localized rapidly and reliably by suitable analysis of the characteristic quantities. In principle, the characteristic quantities of individual manufacturing units 1 can also be input from individual computing units 11 into a central computing unit where the analysis is performed. centrally.

What is claimed is:

1. A wafer processing system in at least one clean room for processing wafers, comprising:

an arrangement of a plurality of manufacturing units for performing individual manufacturing operations necessary for the processing of wafers, said manufacturing units including at least one unit applying a layer to a wafer, at least one etching unit, at least one unit performing wet chemical process, and at least one unit performing a cleaning process;

a transport system for supplying the wafers to and removing the wafers from the individual manufacturing units; and a monitoring unit for monitoring the quality of wafer processing, the monitoring unit including:
  measuring devices arranged in respective ones of said manufacturing units for monitoring at least one process parameter on which depends a quality of manufacturing operations performed therein, and
  computing units associated with respective ones of said manufacturing units for obtaining process data representing the at least one process parameter generated by respective ones of said measuring devices;

said measuring devices determining a time charateristic function of the at least one process parameter;

said monitoring unit being adapted to derive at least one characteristic quantity from said time characteristic function of the at least one process parameter for evaluating the quality of wafer processing from the process data.

2. The system according to claim 1, wherein the process parameters are analyzed statistically in the computing unit to determine the characteristic quantities.

3. The system according to claim 1, wherein the computing unit includes a correlator for correlating the process parameters for determining characteristic quantities.

4. The system according to claim 1, wherein the process parameters are determined as a function of an air pressure and a temperature within the manufacturing unit.

5. The system according to claim 1, wherein the process parameters are determined as a function of quantities of resources supplied to the wafers per unit of time.

6. The system according to claim 5, wherein the resources include at least one of: i) ultrahigh purity water, ii) liquid chemicals, and iii) gaseous chemicals.

7. The system according to claim 5, wherein the process parameters are determined as a function of a pressure and a temperature of the resources supplied to the wafers.

8. The system according to claim 1, wherein the process parameters are determined as a function of a time characteristic of the at least one manufacturing operation conducted at the at least one of the manufacturing units.

9. The system according to claim 8, wherein the process parameters are determined as a function of at least one of: i) physical, ii) electrical, and iii) mechanical parameters of processing devices in the at least one of the manufacturing units.

10. The system according to claim 1, wherein the computing unit is arranged in an operating unit assigned to the at least one of the manufacturing units.

11. The system according to claim 1, wherein all of the respective computing units are connected to a central computing unit to which the respective characteristic quantities are transferred from the computing units.

* * * * *